United States Patent [19]

Koehring et al.

[11] Patent Number: 4,751,399

[45] Date of Patent: Jun. 14, 1988

[54] AUTOMATIC LIGHTING DEVICE

[75] Inventors: Philip A. Koehring; James D. Himonas, both of Los Angeles, Calif.

[73] Assignee: Novitas, Inc., Santa Monica, Calif.

[21] Appl. No.: 941,168

[22] Filed: Dec. 11, 1986

[51] Int. Cl.$^4$ ........................................... H01H 36/00
[52] U.S. Cl. ..................................... 307/117; 307/116; 307/141.4; 307/141; 315/159; 340/529
[58] Field of Search ....................... 307/117, 141, 141.4, 307/116, 115; 315/159, 362, 360; 340/514, 517, 521, 527, 528, 529, 526, 554, 555, 566, 572; 200/61.01, 61.02, 61.69, 61.70, 61.62; 367/94, 197, 199; 343/5, 17, 18

[56] References Cited

U.S. PATENT DOCUMENTS

| | | | |
|---|---|---|---|
| 3,552,520 | 1/1971 | Naubereit | 367/197 |
| 3,922,663 | 11/1975 | Lubke et al. | 307/117 X |
| 3,934,156 | 1/1976 | Galemmo et al. | 307/117 |
| 4,101,886 | 7/1978 | Grimes et al. | 367/197 X |
| 4,207,559 | 6/1980 | Meyer | 307/117 X |
| 4,213,063 | 7/1980 | Jones | 307/141 |
| 4,277,727 | 7/1981 | LeVert | 315/159 X |
| 4,304,967 | 12/1981 | Gretczko | 367/197 |
| 4,315,596 | 2/1982 | Johnson et al. | 200/61.62 X |
| 4,344,071 | 8/1982 | Allen | 307/117 X |
| 4,362,970 | 12/1982 | Grady | 307/117 X |
| 4,391,406 | 7/1983 | Fried | 200/61.62 X |
| 4,408,308 | 10/1983 | Smith et al. | 307/117 X |
| 4,450,351 | 5/1984 | Fraden | 307/117 X |
| 4,461,977 | 7/1984 | Pierpoint et al. | 315/159 |
| 4,521,768 | 6/1985 | Haran et al. | 340/529 X |
| 4,540,984 | 9/1985 | Waldman | 307/141 X |
| 4,568,868 | 2/1986 | Schlepp et al. | 307/117 X |
| 4,636,774 | 1/1987 | Galvin et al. | 307/117 X |
| 4,661,720 | 4/1987 | Cameron et al. | 307/117 |

Primary Examiner—William M. Shoop, Jr.
Assistant Examiner—Paul Ip
Attorney, Agent, or Firm—Ronald W. Reagin; Stephen King

[57] ABSTRACT

An automatic lighting device having a circuit for operating an electric light, a switch for manually actuating the circuit, a detector circuit for determining whether movement above a prescribed threshold level has occurred within the area covered by the electric light within a first preselected period, a circuit responsive to the detector circuit for disabling the circuit for providing electricity if movement has not occurred in the area during the first preselected period, and a circuit for reactivating the circuit for providing electricity in response to the detection of movement in the area within a second preselected period.

5 Claims, 2 Drawing Sheets

AUTOMATIC LIGHTING DEVICE

BACKGROUND OF THE INVENTION

This invention relates to automatic lighting devices and, more particularly, to automatic devices for controlling the state of lights in areas depending upon the presence or absence of persons using the lights.

The need to conserve energy which was made apparent to all with the recent oil crisis has precipitated inventions in a great number of areas. One particular area in which invention has occurred has been that related to automatically disabling electrical devices when the use of those devices has been completed. In particular, a number of arrangements have been devised for automatically turning on and off lights so that when an area is not occupied the lights are switched off thereby conserving substantial amounts of energy. Such a device usually utilizes a motion detector to switch the lights on and maintain them in the on condition while persons are present. A timing arrangement is incorporated into the device to provide a period during which movement must be detected or the lights for the area are extinguished. The timing arrangement allows a person to leave the area or to remain inactive for short periods without the lights being extinguished.

Although such devices are quite efficient energy savers, they do cause problems. For example, since such devices automatically switch the lights on whenever a person is present, they automatically activate the light during daytime hours when their use is a waste of energy. Moreover, the detectors used with such systems often activate lights in unused areas when a person simply passes by the area. Areas using automatic lighting devices often cannot be dimmed for displaying slides or movies.

An attempt to solve these problems by utilizing a manual on switch causes additional problems and, under certain circumstances, may render an area unusable for certain activities. For example, in order to be able to sense when an area is empty, the motion detectors used in such devices must be able to ignore various low level movements within the area such as air currents which are not caused by humans; otherwise, the lights would remain on even though no humans remained in the area. Consequently, such devices must be set to ignore some base level of movement.

This threshold level for maintaining the lighting in operation is often not reached even though the area is occupied by a person if the person is involved in some long term mental activity like reading which involves little physical movement. As a result, prior art automatic lighting devices often extinguish the lights while a person is occupied in concentrated mental activity just when that person can least afford the interruption. If a manual switch is used, this necessitates the person moving about to active the lights and forces a break in the person's concentration. If the person again settles into his mental activity for longer than the timed period, the lights are again extinguished. Such a device obviously detracts from the ability of the person to accomplish the particular mental activity.

SUMMARY OF THE INVENTION

It is an object of this invention to provide an improved automatic lighting device which eliminates the activation of lights during periods in which sufficient ambient light is otherwise provided.

It is another object of this invention to eliminate spurious activation of lights by such an automatic lighting device because of people passing close to the controlled area.

Another object of this invention is to allow the deactivation of the automatic-on feature of an automatic lighting device. Yet another object of this invention is to eliminate the need for one involved in mental activity to continually reactivate lighting extinguished by the low physical level of the activity in an area controlled by an automatic lighting device.

It is another object of this invention to provide an automatic lighting device having an arrangement for automatically relighting an area if the lighting is extinguished while a person remains in the area involved in some activity requiring less than the threshold level of movement.

These and other objects of the invention are accomplished by an automatic lighting device which includes a circuit for operating electric lights which is arranged to be activated and deactivated manually, detection circuitry adjusted to detect movement above a prescribed threshold level within the area served by the light during a first preselected period, a circuit for disabling the circuit for providing electricity when the detection circuitry determines that movement has not taken place within the area during the first preselected period, and a circuit for reactivating the circuit for providing electricity in response to a signal indicating movement within the area within a second preselected period after the disabling of the circuit for providing electricity.

Other objects, features, and advantages of the invention will become apparent upon reference to the specification taken in conjunction with the drawings in which like elements are referred to by like reference characters throughout the several views.

DESCRIPTION OF THE PREFERRED EMBODIMENT

Figure 1:
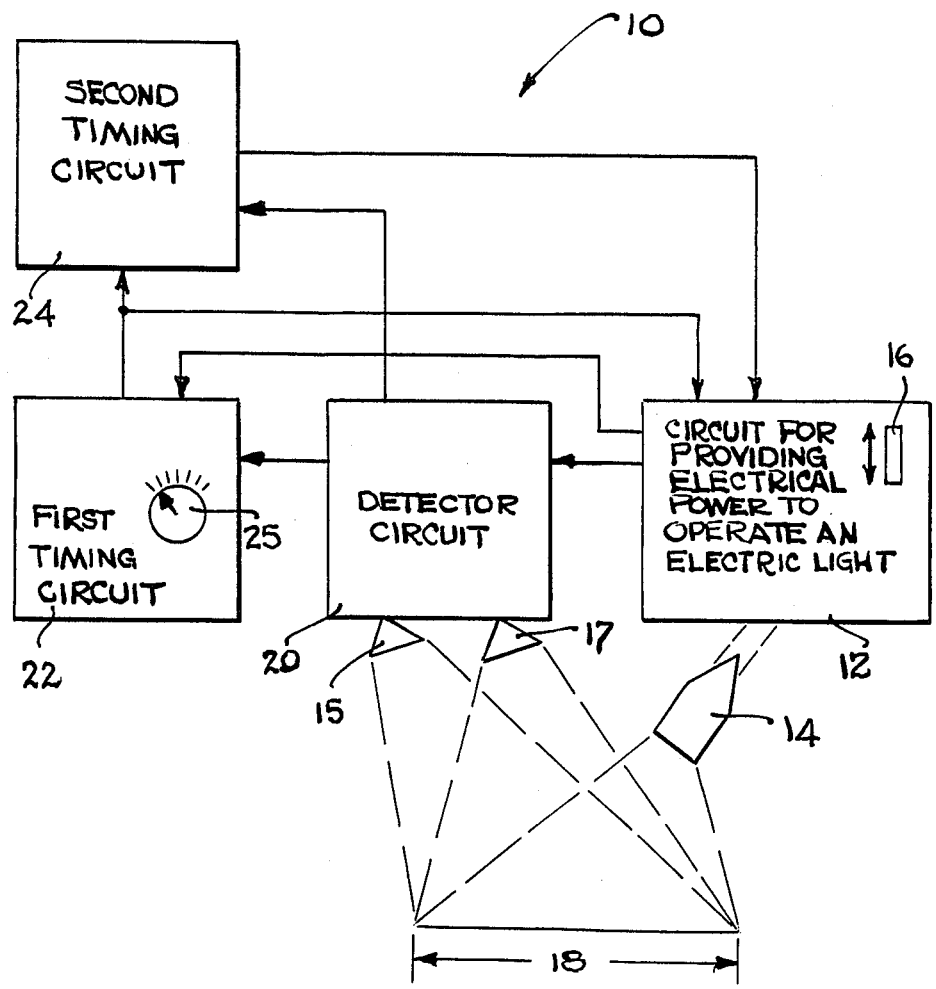
FIG. 1 is a block diagram of an automatic lighting device constructed in accordance with the invention.

Referring now to FIG. 1 there is shown a block diagram of an automatic lighting device 10 constructed in accordance with the invention. The device 10 comprises a circuit 12 for providing electrical power in a well known manner to operate an electric light (or lights) 14 in response to the actuation of a momentary pushbutton manual on-off switch 16. The circuit 12 may be one used to operate normal electric light bulbs, flourescent tubes, or any other type of light producing arrangement. All such devices and the circuitry for operating them to provide light are well known to the prior art. The light 14 is arranged to shine on a preselected area which is designated 18 in FIG. 1. The circuit 12 operates in conjunction with a detector circuit 20, a first timing circuit 22, and a second timing circuit 24.

The detector circuit 20 is constructed in a manner well known in the art to detect motion within the area designated 18 in FIG. 1. For example, the circuit 20 may comprise an acoustic transmitter 15 arranged to beam signals to the area 18, an acoustic receiver 17 positioned to receive signals originated by the transmitter and returned from the area 18, and various filtering and amplifying circuits arranged in a well known manner to provide electricals signals indicative of the detection of motion in the area 18. As described above, the receiver is set to ignore signals having a level less than a selected threshold level so that air conditioning and other non-human motion causing sources do not activate the light 14.

When the device 10 is activated by the manual switch 16, the first timer 22 is also activated and begins a preset timing cycle. The preset timing cycle may be varied manually by adjustment of a variable input device 25 to measure a time span which in the preferred embodiment may vary between thirty seconds and twelve minutes. This allows a user to select a period which is appropriate to his particular use. For example, the user may want to allow the lights to stay on while he leaves the area for short intervals of time and thus adjust the timer 22 to provide a relatively long period.

A timer constructed to provide an electrical output signal upon the passage of the time preselected is a device well known to the prior art. It is also well known to provide an input to such a timer for resetting the time period. In the automatic lighting device 10 this is accomplished by a signal sent from the detecting circuit 20 upon each detection of motion within the preselected area 18. The timer 22 is arranged to provide an output signal upon the passage of the preselected period set by the variable input device 25. This output signal is transferred to the electric circuit 12 to turn off the light 14.

Consequently, once the circuit 12 is energized and the area 18 is lighted, the presence of a person within the space moving about at intervals of less than the preselected limit set by the device 25 for the first timer 22 maintains the light 14 in the on condition. The use of a manual on switch eliminates the automatic provision of light during daylight hours and the spurious activation of lights in the controlled area by persons detected passing by the area. The provision of a manual off function allows the automatic lighting to be deactivated for slides, movies, and the like.

However, even though the light 14 is normally maintained on once the area 18 is occupied, if a person in the area 18 is involved in mental rather than physical activity, it is entirely possible that the preselected period may pass without movement above the threshold level able to be detected by the detector 20. This occurs because the automatic lighting device 10 is set to ignore some base level of movement; and the threshold for maintaining the lighting in operation is often not reached even though the area is occupied by a person if the person is involved in some long term mental activity which involves little physical movement such as reading. In such a case, when the period has passed, the light 14 is turned off; and the area is plunged into darkness. In order to turn the lights back on, a person would have to move to the manual switch 16, completely disturbing his attention to his particular endevour.

In the present invention this problem is eliminated by the second timer 24 which is activated by a signal from the first timer 22 when the preselected period has passed and the light 14 is turned off automatically. During a second preselected period, the timer 24 responds to a signal from the detector 20 indicating movement in the area 18 to provide a signal to cause the electrical circuit 12 to turn the light 14 back on. Consequently, if the light 14 is extinguished inadvertently while a person is still in the area 18 because of an undetectable level of motion, the person may by making a simple detectable movement (such as shaking his head or waving his hand) cause the light 14 to be turned back on and the timer 22 to restart its timing period without any appreciable interruption of the person's activity.

Figure 2:
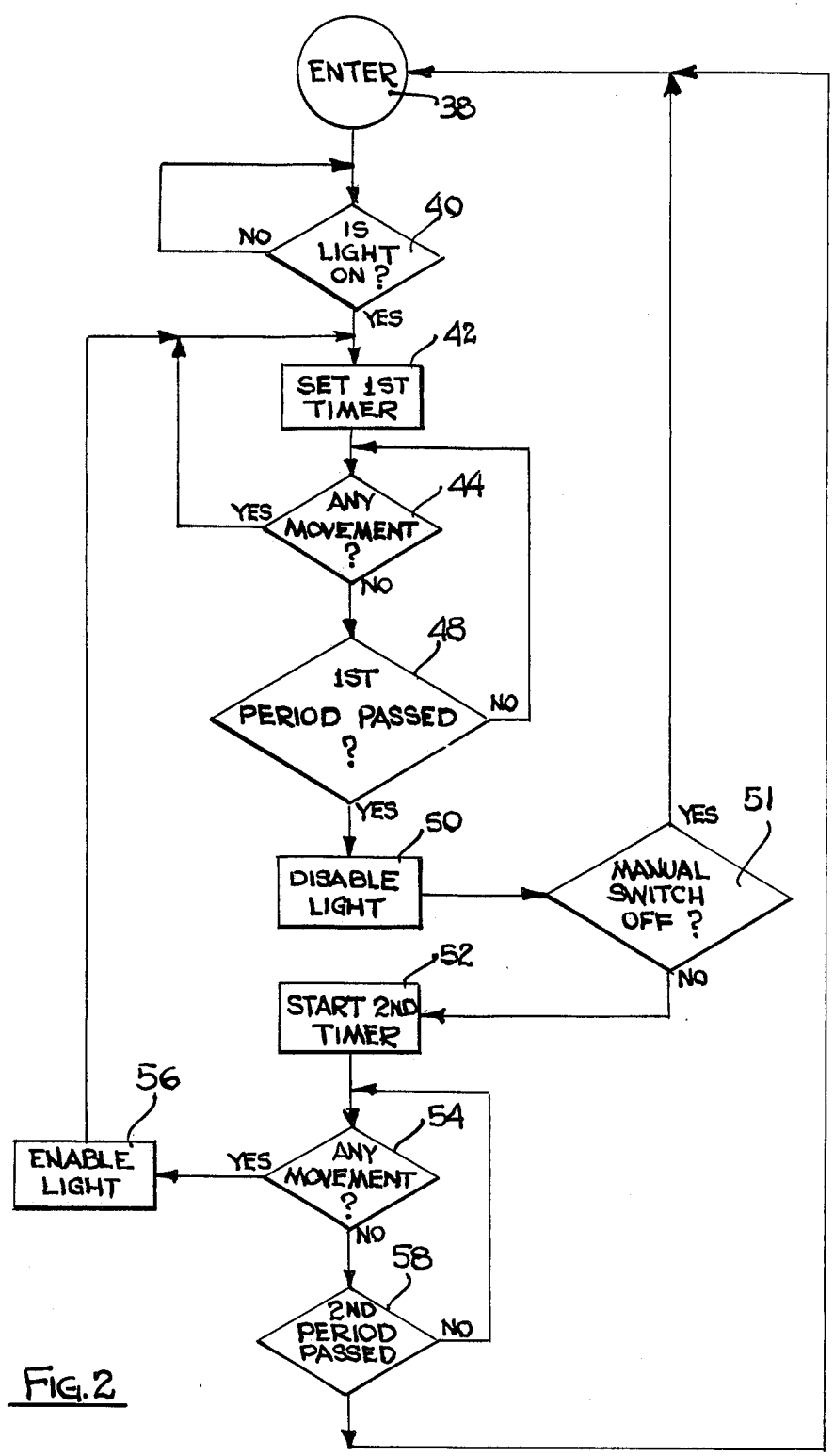
FIG. 2 is flow chart illustrating the logical operation of an automatic lighting device constructed in accordance with the invention.

The operations provided by the detector 20, the first timer 22, and the second timer 24 might also be furnished by circuitry such as integrated circuits utilizing semiconductor technology. FIG. 2 illustrates a flow chart for the operation of such circuitry which may be constructed in accordance with teachings well known in the art.

As is shown in FIG. 2, the sequence begins at entry step 38 at which the switch 16 is moved to the on position. At step 40 a determination is made as to whether the circuit 12 has been energized so that that operation need continue. If the circuit 12 has not been energized, the program merely recirculates. If the light 14 has been turned on, then the operation moves to step 42 at which a timing period of a first timer is set. The program then moves to step 44 at which a determination is made whether there is movement in the area 18. If movement is detected in the area 18, the program move back to step 42 to reset the first timer period and then back to step 44. If there is no movement in the area 18, the program moves to step 48 where a determination is made whether the preset period of the first timer has passed. If the period has not passed, the program recirculates to step 44 to look for motion.

If the period has passed, the program moves to step 50 to disable the light 14 and then to step 51 at which a determination is made whether the light 14 has been switched off manually. If the light 14 has been switched off manually, the program recirculates to step 38. If the light 14 has been switched off automatically, the program moves to step 52 to start the second timer 24. From step 52 the program moves to step 54 where a determination is made whether there is movement in the area 18. If there is movement, the program moves to step 56 to turn the light 14 back on and then recirculates to step 42 to reset the first timer. If there has been no movement, the program moves to step 58 to determine whether the second period has passed. If the second period has not passed, the program recirculates to step 54 to determine if there is yet movement. If the second period has passed, the program recirculates to step 38 and waits to be restarted upon the manual activation of the switch 16.

Thus, the program illustrated in FIG. 2 accomplishes the same result as the circuit of FIG. 1. The program is entered when the circuit 12 is activated to turn the light 14 on. It then sets the first timer to a preselected period and looks for motion in the area. As long as motion occurs, it continues to reset the first period so that the light 14 remains on. When the first period passes without motion, the light 14 is extinguished, the second timing period is set, and the program looks for motion. If motion occurs during the second period, the light 14 is switched back on. If not, the light 14 remains off and must be reactivated manually.

As will be understood by those skilled in the art, various arrangements other than those described in detail in the specification will occur to those persons skilled in the art which arrangements lie within the spirit and scope of the invention. It is therefore to be understood that the invention is to be limited only by the claims appended hereto.

What is claimed is:

1. An automatic lighting device comprising a circuit for operating an electric light, means for manually activating the circuit for operating an electric light, means for detecting whether movement above a prescribed threshold level has occurred within the area covered by the electric light within a first preselected period, means responsive to the means for detecting whether movement has occurred for disabling the circuit for operating an electric light if movement has not occurred in the area during the first preselected period, and means for reactivating the circuit for operating an electric light in response to the detection of movement in the area within a second preselected period.

2. An automatic lighting device as claimed in claim 1 further comprises means for manually deactivating the circuit for operating an electric light.

3. An automatic lighting device as claimed in claim 1 further comprising means for varying the length of the first preselected period.

4. An automatic lighting device as claimed in claim 1 in which the means for detecting whether movement has occurred within the area comprises an acoustic transmitter for generating signals into the area, and an acoustic receiver for receiving signals from the area.

5. An automatic lighting device as claimed in claim 1 in which the means for reactivating the circuit for operating an electric light in response to detection of movement in the area within a second preselected period includes a timing circuit responsive to signals from the means for disabling the circuit for operating an electric light for setting the second preselected period, and means for monitoring the means for sensing movement during the second period.

* * * * *